United States Patent [19]

Schwartz

[11] Patent Number: 4,823,391

[45] Date of Patent: Apr. 18, 1989

[54] SOUND REPRODUCTION SYSTEM

[76] Inventor: David M. Schwartz, 26873 Moody Rd., Los Altos Hills, Calif. 94022

[21] Appl. No.: 887,955

[22] Filed: Jul. 22, 1986

[51] Int. Cl.⁴ .............................................. H03G 5/00
[52] U.S. Cl. .................................................. 381/103
[58] Field of Search ........................... 381/103, 98, 24

[56] References Cited

U.S. PATENT DOCUMENTS

| | | |
|---|---|---|
| 3,922,488 | 11/1975 | Gabr . |
| 3,937,887 | 2/1976 | Miller . |
| 3,941,932 | 3/1976 | D'Hoogh . |
| 3,949,325 | 4/1976 | Berkovitz ............................ 381/103 |
| 4,109,107 | 8/1978 | Boast .................................... 381/103 |
| 4,139,733 | 2/1979 | Falkenberg . |
| 4,229,618 | 10/1980 | Gamble . |
| 4,254,303 | 3/1981 | Takizawa . |
| 4,458,362 | 7/1984 | Berkovitz et al. .................. 381/103 |
| 4,549,289 | 10/1985 | Schwartz et al. .................... 381/71 |
| 4,553,257 | 11/1985 | Mori et al. . |
| 4,611,343 | 9/1986 | Rapaich ............................. 381/103 |

FOREIGN PATENT DOCUMENTS 0119645 9/1984 European Pat. Off. ............ 381/103
2068678 8/1981 United Kingdom ................ 381/103

OTHER PUBLICATIONS

Radio Shack Catalog, 1985, p. 5, Amazing Compact Disc Digital Audio Player.

*Primary Examiner*—Forester W. Isen
*Attorney, Agent, or Firm*—Shoemaker and Mattare

[57] ABSTRACT

A sound reproduction system for automatically adjusting the output characteristics of a speaker or speakers in response to the acoustical characteristics of the external environment for the speakers by the use of sensors operatively connected to a microprocessor which in turn is connected to further processing in a digital preamplifier which processing includes comparison of data received from the sensor about the environment and the audio signal treatment by the environment and alters the output of the digital preamplifier to compensate for the environment and changes in the environment.

1 Claim, 3 Drawing Sheets

SOUND REPRODUCTION SYSTEM

BACKGROUND OF THE INVENTION

This invention relates to audio reproduction systems and in particular, to systems utilizing conventional speakers for the creation of sound waves which are reproductions of originally recorded audio signals.

Conventional electro-acoustic transducer systems for the reproduction of audio signals, generally referred to as loudspeakers, are designed to output a close approximation of the sound pressure waves generated by the original audio signal. Generally, the assumption is made during the design that the playback and amplification systems are linear with respect to the relationship between the input and output waveforms. A further assumption is generally made that the loudspeakers themselves exist in a perfect acoustic environment. In fact, they are tested in anechoic chambers during the design and production quality assurance processes. Some manufacturers provide for frequency spectrum control at the loudspeaker to compensate for the actual listening environment's effects on the sound waves after they have left the loudspeaker. Very small adjustments are feasible this way before distortion is objectionable to most listeners.

Most loudspeakers designers depend on the listener's application of audio frequency band equalization controls on the pre-amplifier to accommodate the large range of possible listening environments. This is less than desirable means of solving the problems of variable listening environments due to the side effects of conventional equalization (EQ) systems, leading to distortion of the signal, and the dynamic nature of many listening environments over time; as in a room that may have 1 or 25 persons in it, or re-arrangement of furniture.

Solutions have been proposed to the environment coupling problem previously described. The most commonly employed prior method has been to utilize a carefully placed microphone, near the "average" listening zone of a room, a signal generator or a test signal tape or disk, and a spectrum analyzer. Typically, the test tones were played back through the loudspeakers while the received spectral distribution of the signal was compared to the desired flat response curve. The difference identified was either automatically or manually applied to control the equalization settings of the audio reproduction system. Using this test procedure, environments that, for example absorb bass, could easily be detected and the proper amount of boost to such lower frequency regions of the audio spectrum could be applied.

More sophisticated methods have also been employed to measure the signal in the time domain. To correct for echoing environments, the departure and return times of a brief audio impulse are measured and appropriate compensation taken. The microphone typically would have to be moved many times to locate so-called hot spots, which can then be deadened with acoustically absorbent material. Acoustically "Dead" rooms are generally measured in the same way, with reflective materials properly placed to compensate for absorption. This process can be tedious, and generally requires a highly skilled acoustician. Even after repeated trials, some rooms remain acoustically problematical. Combining loudspeakers, environments and people has presented a hitherto unsolved problem.

OBJECTIVES OF THE PRESENT INVENTION

It is therefore an objective of the present invention to provide an apparatus and system for continuously adjusting the output of audio speakers to accommodate for changes in the sound environment for an audio playback system.

SUMMARY OF THE INVENTION

Figure 1:
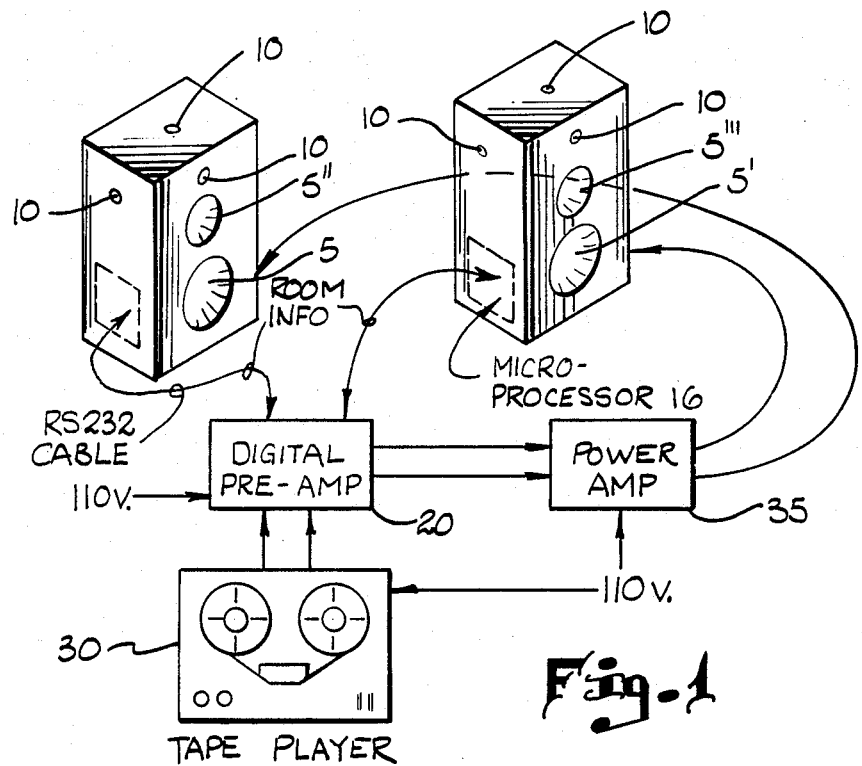
FIG. 1 is a partial schematic illustration of one embodiment of the present invention.

The solution to the majority of problems encountered in various audio listening environments is to give the audio reproduction system loudspeaker/pre-amplifier subsystem the equivalent of ears and a brain. In one embodiment of the present invention, sonar modules such as the Polaroid brand Polapulse TM devices are attached, or otherwise placed in proximity to the exterior surfaces including the front, top and sides and back of each loudspeaker cabinet. These in turn are attached to a coder-decoder microprocessor which can either be built into, or attached to the cabinet. The coder-decoder is preferably also connected to a digital pre-amplifier. The coder-decoder, while continuously connected to the sonar sensors, is preferably activated periodically when the system is operating to process the information received from the sonar modules. The speaker cabinet coder/decoder microprocessor combination is preferably designed to activate the sonar units in a predetermined sequence. The return signal detected by the sonar unit can be decoded to provide information about the distance to the nearest solid object, its percentage of obstruction of the view angle, and the absorption properties of the surfaces at predetermined frequencies. The multiple signals from the sonar units on each speaker cabinet can thereby be de-coded and analyzed to provide a spectral profile of the environment and an acoustic measurement of the loudspeakers, audio reproduction characteristics in that environment. Other transducer devices can also be employed to provide much the same kind of information for control of the spectral audio output of speakers.

The digital code summarizing each speaker cabinet's acoustic environment is then transmitted preferably to a digital pre-amplifier periodically, for example, every five minutes, although the period of sampling may be variable. The digital pre-amplifier is designed to utilize this information in several ways. First, the audio spectral information received by the sonar modules can be processed in a manner to produce signals which are used to preselect the outputs of multi-band equalizer software. This processed information can be used to shape the analog signal produced by the digital preamplifier and its processing means and then sent to a power amplifier, so that the speakers response remains "flat" relative to the environment sensed. Since the equalization process described hereinafter is performed in the digital domain, no side-effect distortion, arising from band to band leakage, for example, as normally experienced in analog equalization, is imposed on the signal. Therefore, the digital pre-amplifier can be as heavy-handed as it needs to be to do the job.

Secondly, the sonar information can also be used to resolve time domain problems. With respect to correcting time domain problems, the pre-amplifier can be programmed to compensate for "dead" rooms by adding reverberation to the signal. Compensating for overly "live" rooms can be accomplished by subtracting reverberance from the signal. While this is more difficult computational problem, some measure of compensation can be provided by the system of the present invention.

Thirdly, the present system can be utilized in an interactive mode to modify the acoustic environment and/or the signal itself. Either by direct action on front panel controls, or by use of a personal computer attached to the pre-amplifier, the listener can personally modify, over a wide range, the signal processing parameters. These features might include EQ, echo, reverb, chorusing, harmonizing, mixing and panning. Such features will be especially useful when one of the audio pre-amplifier input signals is a musical instrument, in addition to the pre-recorded, or broadcast source. For example, an amateur musician could play along with a stereo simulcast of a live performance without sounding "tacked-on" to the broadcast signal.

The most cost-effective way of implementing the system is to build the environment sensing hardware and microprocessors into the speaker cabinetry at the time it is manufactured. An add-on after-market module that sits on top of any speaker is also practical. The speaker cabinet hardware can communicate with the pre-amplifier in several ways, including hard wiring, infra-red broadcast, or radio frequency broadcast.

The environmental measuring devices may be the Polaroid Brand units discussed above, which are ultrasonic devices or radio frequency devices, or simple acoustic pressure transducers, i.e. microphones.

The use of a digital pre-amplifier improves the performance of this system, but a conventional analog pre-amplifier, with suitable add-on circuitry to decode the information coming from the speaker cabinet microprocessor, is also feasible. Some of the features discussed above, such as time domain processing, become difficult to implement cost-effectively if all pre-amp circuits are analog.

DETAILED DESCRIPTION OF THE INVENTION

Referring to FIG. 1, speaker cabinets 2 and 3 are shown with speakers 5 and 5', 5" and 5"' and sonar-type sensors shown generally as 10. Microprocessors 15 and 16 are provided for processing the signals provided during audio reproduction by the sensors 10. Two way communication between the microprocessors 15 and 16 and the digital pre-amplifier 20 is provided by the RS-232 ports and cable shown. The signal source 30, which can be any analog or digital playback system, is electrically connected to the digital preamplifier 20 which, in turn provides a modified signal, as described herein, to the power amplifier 35.

During operation of the systems shown in FIG. 1, the output from the tape player 30 is fed to a digital preamplifier 20 whose output is amplified by amplifier 35 to power the speakers. The sensors 10, periodically sample the acoustical environment, as described herein, the resultant signals are processed to provide the spectral characteristics of the environment and the resulting information in digital form is employed by the digital preamplifier 20, in a manner described more fully hereinafter, to modify the signal output of the preamplifier 20 to compensate for the different acoustical absorbance characteristics of the environment, or for any time domain, or other problems. It is possible, according to this invention, to select other controllable variables for incorporation into the design of the preamplifier itself.

Figure 2:
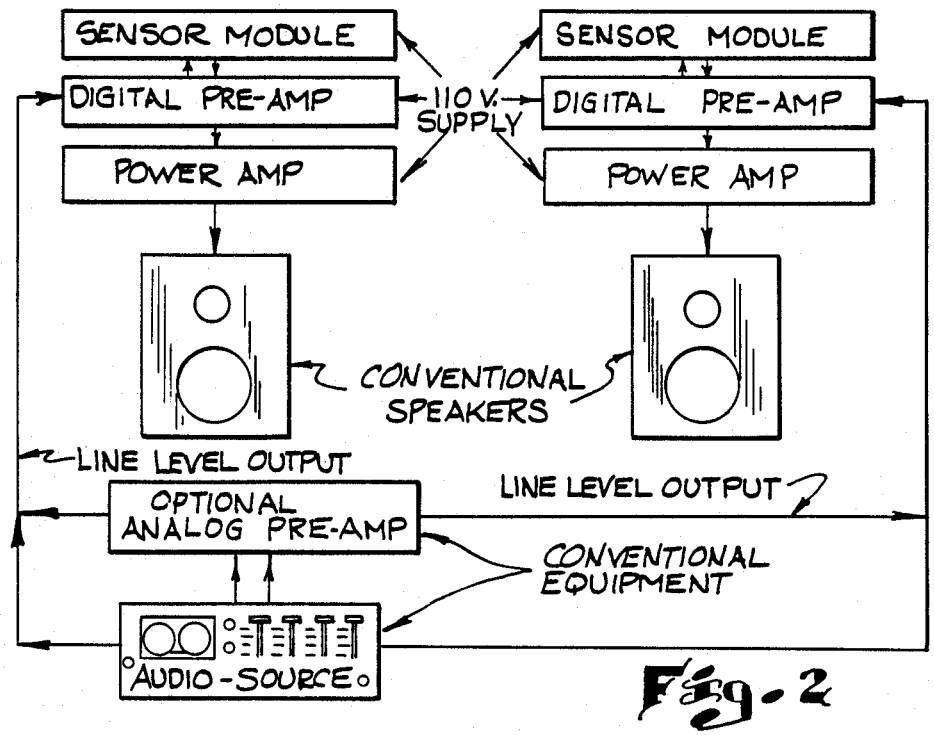
FIG. 2 is a partial schematic illustration of another embodiment of the present invention.

Referring to FIG. 2., a schematic illustration of another embodiment of the present invention is shown. In this embodiment conventional equipment is employed for the audio source, optionally including an analog preamplifier. The output of the analog preamplifier is then again processed by a digital preamplifier before being amplified. The sensor module, which need not be built into the speaker cabinet then would contain the signal processing capability described herein and the output of the module would still be capable of being used by the preamplifier to achieve the previously described modifications to the output of the preamplifier to compensate for the acoustical and time domain variables of the listening environment.

Figure 4:
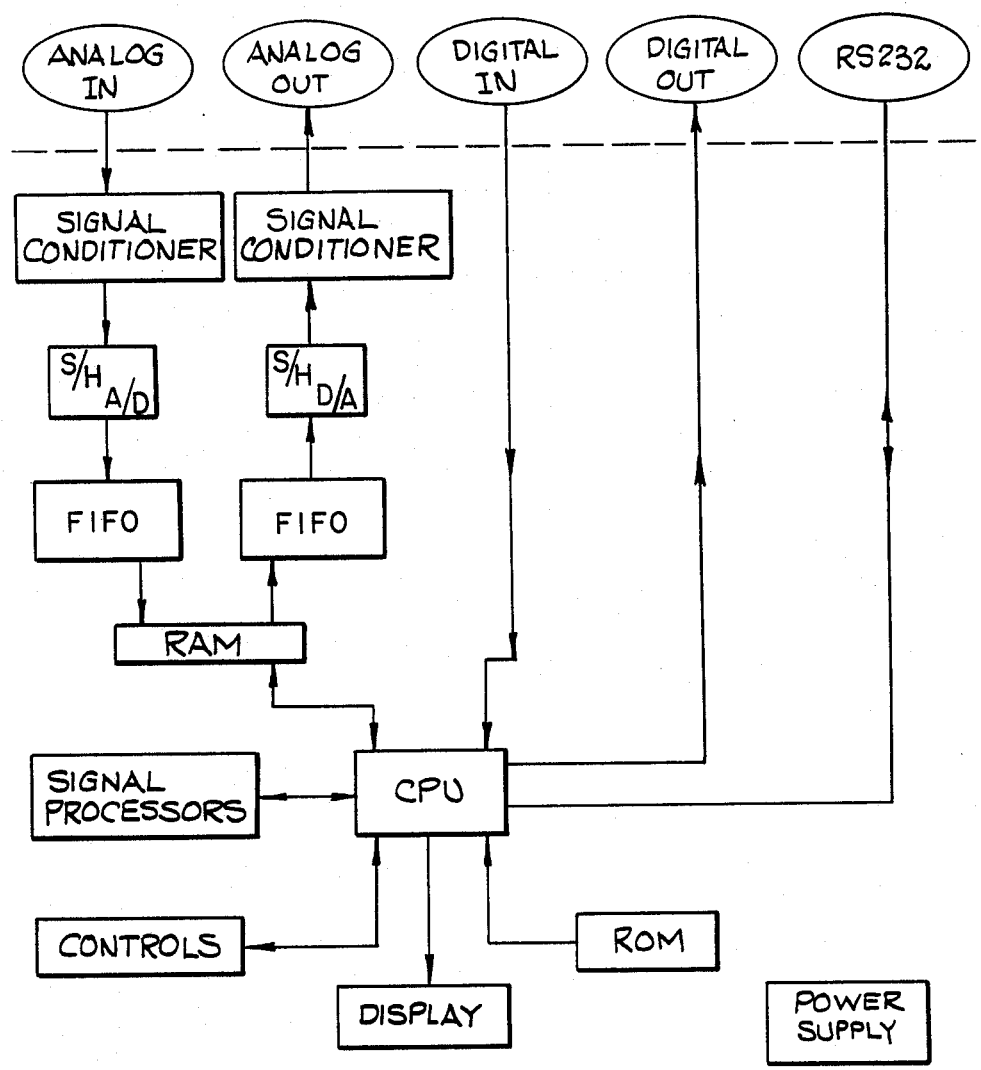
FIG. 4 is a schematic block diagram of a digital pre-amplifier useful in the embodiment of the present invention shown in FIG. 1.

Referring to FIG. 4, the preferred functions of the digital amplifier used in the present invention are schematically illustrated. For example, if the input signal is an analog signal, the signal is conditioned first in the signal conditioner and then converted from analog to digital format and then stored in a first-in, first-out buffer. Alternatively, if the signal source is digital, it can be processed directly by the CPU. The function of any audio preamplifier is to pre-condition the audio signal prior to high power amplification. Conditioning of the signal may include all or some of the following processes:

(1) Level setting: The input signal level to the preamplifier is amplified or attenuated to the desired value. For example, the input signal from a moving coil phonograph cartridge must be amplified approximately 40 dB, while the input from a radio receiver may only require 10 dB of level amplification. Some signals, such as those from professional audio equipment, must be attenuated by up to 30 dB in the preamplifier.

(2) Equalization: Input signals may require modification of their frequency spectrum either because they are biased as they appear at the input, or to compensate for anticipated bias in the audio reproduction chain somewhere after the preamplifier. An example of the former case is the input signal that arrives at the preamplifier from a phonograph record recorded with the RIAA mid-range frequency EQ curve that boosts the mid-range of the signal to compensate for average characteristics of most cartridges. Some users of that signal may wish to flatten the RIAA curve in the preamplifier. An example of the latter case is the anticipation of distortion of bass or high frequencies by the loudspeakers used. The preamplifier is then used to boost the signal level in those bands that will be attenuated by the speakers, or the speaker/room interaction.

(3) Channel Control: The two signals, typically left and right, may be individually controlled with respect to output level. They may also be "blended" to achieve an even stereo audio image when the speakers are widely separated. Another channel control feature is the mute button, which allows a channel to be silenced at the press of a button.

(4) Input to Output Route Control: One of the most important features of all preamplifiers is the control they provide over selection of input signal routing. Typically, multiple inputs are connected to the preamplifier, such as tuner, turntable, tape deck 1, tape deck 2, Compact Disc ™ player, or any audio device. The user may wish to route tape 1 to tape 2 for dubbing at the same time listening to the turntable. The preamplifier front panel controls allow for any arbitrary set of signal paths either across the internal audio bus of the preamplifier, or input to output.

(5) Remote control: Some preamplifiers offer the user a wireless means of controlling all or some of the preamplifier's functions. This may be infrared, RF, or ultrasonic sending unit.

Conventional analog preamplifiers can provide all of the functions discussed above. The problems associated with fulfilling some of these functions involve the addition of noise and/or distortion to the input signal while performing the function. For example, the EQ function involves analog filtering of the signal into discrete bands for processing. Analog filters of the type usually employed in a preamplifier introduce distortion in the form of sideband leakage, so that the audio signal becomes "muddy". The filters also have a background noise level of their own which inevitably lowers the overall signal to noise ratio of the filtered signal.

Many preamplifiers are also subject to switching noise during the routing process. Punching in tape 1 to record onto tape 2 can result in an audible "click" due to the physical switching process.

Increasing or decreasing the level of the input signal may also introduce noise.

The digital preamplifier, preferred for use in the present invention, provides an improvement on the performance of conventional analog preamplifier. In addition, a digital preamplifier can provide new features that can only be accomplished in the digital domain.

Figure 3:
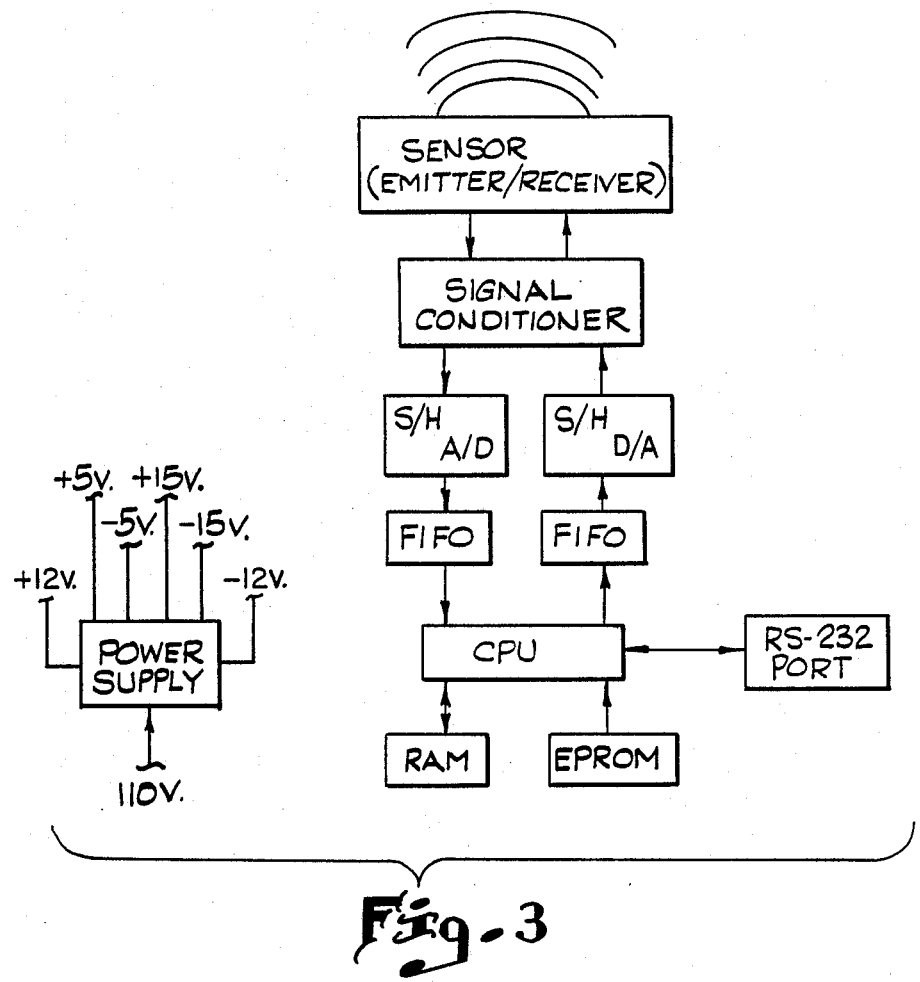
FIG. 3 is a schematic block diagram of a separate sensor 1 the microprocessor used for the speaker-environment analysis in the embodiment shown in FIG. 2.

Referring to both FIGS. 3 and 4 the sensor and processing functions are schematically shown which can be housed in preselected locations.

(1) Analog Signal Conditioner: This module contains the high and low pass filters, and the solid state amplifiers necessary to bring any input signal to the correct line level for digital conversion and processing.

(2) Digital Signal Buffer/Converter: Signals that are already digitized may also be accepted directly by the digital preamplifier. Such signals are available from certain Compact Disc ™ players currently on the market. However, these signals must be buffered (temporarily stored) to allow for any conversions to the internal data format of the digital preamplifier prior to further processing.

(3) Analog to Digital Converter: Analog input signals are conditioned, then held in a sample and circuit (S/H) prior to conversion to a digital value. A typical system will operate at 44.1 kHz to allow for a 20 to 20,000 Hz frequency response at the output.

(4) Signal Processor Module: Digital audio signals either directly or after analog to digital conversion are manipulated mathematically by one or more microprocessors for the purpose of performing the functions of the preamplifier. Digital spectrum analysis can be performed by means of Fourier, Hadamard, or similar mathematical transformations, for the purpose of modifying EQ functions with adaptive Finite Impulse Response (FIR) filters or Infinite Impulse Response (IRR) filters. These are preferably used in arrays to accomplish the desired functions. An example of signal processing means which can be employed is described in U.S. Pat. No. 4,472,747, issued Sept. 18, 1984, of the inventor which description is incorporated herein by reference in its entirety. Digital level control can be performed by multiplication of the sample, or block of samples (the digital signal) by a gain coefficient, then adding the result to the sample or block of samples. Signal routing by logical switches (gates) on the digital bus can provide noiseless audio switching.

(5) Digital to Analog Module: After processing, the digital signals must be converted back to the analog domain for output to their destination device, such as a conventional analog power amplifier. The digital to analog converter module is composed of a commonly available sample and hold circuit and a digital to analog circuit.

(6) User Controls: The user controls module includes the front panel as well as means for remote control input from a hand held transmitter, or personal computer.

(7) Input/Output Jackfield: The back panel of the selected or designed digital preamplifier may contain connectors for multiple analog inputs and outputs, and at least one stereo pair of digital audio I/O, as well as computer interface connectors for personal computers, modems, and other digital devices.

(8) System Manager: The system manager is the CPU and its random access memories; RAM for process workspace, and EPROM for operating system and built-in program storage.

The maximum benefit from the digital preamplifier will be obtained by users who own digital recording and playback equipment, such as the currently available Compact Disc ™ players, or CompuSonics ™ DSP-1000, as well as a personal computer and the smart speaker system described herein. In this arrangement, pre-recorded digital audio could be played back through a digital signal path with full digital EQ, matched to the room acoustics, and programmable interactive control via the personal computer for editing digitally on, for example, the DSP-1000.

In operation the microprocessor in the speaker or sensor module accesses a program in EPROM, called "Find—Env", that controls the test signal output of the sonar sensors, and analyzes the reflected signals. The ultrasonic (40,000 Hz) test signals can be controlled for the following factors:

* start of test signal
* duration of test signal
* pattern of test signal impulses
* sequence of active sensors In a simple case, the microprocessor directs a speaker surface mounted sonar device to output a single impulse at a precisely timed moment. A record is placed in RAM of the exact time the impulses will leave the sonar device, given the built-in latency of the circuit itself. This impulse, traveling at the speed of sound, strikes a wall and is reflected back to the sensor, which acting as a pressure transducer, converting the returned impulse to an electrical signal. The signal is converted into a binary value by an analog to digital converter. The binary value is passed to the microprocessor's CPU into RAM. Looking at the two values in RAM, the CPU compares the record of the time the signal left the speaker with the time at which it was received. From this difference measurement, given a mathematical formula from the EPROM about distance calculation based on the speed of sound, the microprocessor can calculate the position of the reflecting surface.

Each sensor on the speaker is activated sequentially to arrive at a multi-dimensional model of the enclosure in which the speaker is to operate. In some cases the sensors will be obstructed by the floor or immediately adjacent walls. Thus non-reflection of a test signal also yields information about the room enclosure.

In the process of finding the size of the room, described above, the microprocessor stores information in RAM regarding anomalies. Spatial anomalies are predefined in the EPROM as rooms that don't "close". For example, normal rooms have four walls, a floor and a ceiling. Special rooms may have more than four walls, or an open end, or an open end and sides. In all cases, these are "understood" by matching to EPROM definitions of "normal" spaces. If, after testing for room size as described herein, the space doesn't match up to "normal" definitions, or can not be computed at all, the computer enters another program from EPROM called "Obstructs" that tests to determine if the anomaly is due to forward obstruction of the speaker by a large object, such as a sofa.

To test for a forward obstruction of the so called view angle, the microprocessor uses a pair of sensors on the speaker or sensor module. Preferably, the left and right side sensors of the unit. A test impulse is emitted from one sensor, and received by the other. The number of clear reflections counted in one test indicates the number of surfaces the impulse bounced from. In this way, although no useful data may be available from the front sensor about the obstructing object, any adjacent pair of sensors will accomplish this task.

A third program used by the microprocessor is called "Imps". It uses the sensors to measure the audio frequency absorption characteristics of the room and its contents. When a complex waveform, such as music, leaves the loudspeaker and strikes an object it is reflected back at the speaker as a waveform modified by the frequency dependant absorption of the reflecting object. When multiple objects interfere with the music, the impulse response at the primary delay time is selected to be the response to be calculated.

There are two principal steps in calculating the impulse response of the room. First, a predetermined waveform is emitted by the sensor. This waveform, which may be one of many available in EPROM, is converted from its digital word format into an analog output test signal by a conventional D/A circuit. The returned waveform is converted back to digital format, stored in RAM, and cross-correlation calculations performed to determine maximum absorption at the primary delay time of the waveform. Next, the impulse response of the reflecting object is computed by comparison of the observed data with the known anechoic impulse response characteristics of the speaker itself as measured in an anechoic chamber. The anechoic chamber impulse response characteristics of the speaker are stored in EPROM. By repeating the procedure defined above with each sensor, mounted on all surfaces of the speaker cabinet, a directionally weighted average impulse response of the room and its contents can be calculated.

The foregoing discussion pertains to sensors that operate on the pressure-transducer principle within the audio and ultrasonic audio bandwidth where sound pressure driven electrical transducer work well. It is conceivable that sensors based on other types of transducers such as opto-electric, or RF-electric principles could be employed. For example, an optical laser beam emitter coupled to a photo-electric cell receiver could be used to sense the dimensions of rooms. However, any calculation of impulse response in the audio spectrum would have to be based on some optical analogy, which is subject to non-linearity due to the difference in the absorption properties of materials in the electromagnetic spectrum versus the audio spectrum. An RF based sensor system would have similar problems.

The foregoing description of the invention has been presented for the purposes of illustration and description. It is not intended to be exhaustive or to limit the invention to the precise form disclosed, and other modifications and variations may be possible in light of the description provided herein. The embodiments described explain the principles of the invention and its practical application to thereby enable others skilled in the art to best utilize the invention and various embodiments and various modifications are possible which can achieve the particular use contemplated. It is intended that the appended claims be construed to include other alternative embodiments of the invention except insofar as limited by the prior art.

I claim:

1. A sound reproduction system capable of sensing and compensating for the acoustic environment in which it is placed comprising:

audio source means for producing an electrical signal representative of a recorded audio signal;

digital preamplification means comprising means for receiving said electrical signal from said audio source means and digital signal producing means for producing a digital signal corresponding to the electrical signal produced by said audio source means, said preamplification means being capable of converting said digital signal into a converted digital signal having preselected audio characteristics and further being capable of converting said converted digital signal into an analog signal;

power amplification means operatively connected with said preamplification means for receiving and amplifying said analog signal;

speaker means located in an acoustic environment and operatively connected to said power amplification means to receive the amplified analog signal and convert the amplified analog signal into an audio signal representative of the recorded audio signal;

spatial sensing means for periodically sensing preselected spatial characteristics of the acoustic environment of said speaker means; and a microprocessor means provided with data storage means and operably connected to said spatial sensing means and the output of said digital preamplification means for comparing the preselected spatial characteristics and, therefore, the spectral profile of the acoustic environment sensed by said spatial sensing means with the characteristics of an anechoic environment for the speaker means, to produce signals which are used to convert the digital signal produced by said digital preamplification means in a predetermined manner to compensate for differences between the spectral profile of the acoustic environment of the speaker means produced by said sensor means and said microprocessor means, with an anechoic environment.

* * * * *